United States Patent [19]

Angle

[11] 4,417,264
[45] Nov. 22, 1983

[54] ELECTRICALLY ALTERABLE, NONVOLATILE FLOATING GATE MEMORY DEVICE

[75] Inventor: Rodney L. Angle, Somerville, N.J.

[73] Assignee: RCA Corporation, New York, N.Y.

[21] Appl. No.: 472,565

[22] Filed: Mar. 7, 1983

[51] Int. Cl.³ .................... H01L 29/78; H01L 27/02; H01L 29/04; G11C 11/40
[52] U.S. Cl. ........................ 357/23; 357/41; 357/59; 365/185
[58] Field of Search ............. 357/23 VT, 41; 365/185

[56] References Cited

U.S. PATENT DOCUMENTS

| | | |
|---|---|---|
| 3,500,142 | 3/1970 | Kahng ........................... 357/23 VT |
| 3,825,946 | 7/1974 | Frohman-Bentchkowsky ..... 357/23 VT |
| 4,099,196 | 7/1978 | Simko ........................... 357/23 VT |
| 4,203,158 | 5/1980 | Frohman-Bentchkowsky ..... 357/23 VT |
| 4,328,565 | 5/1982 | Harari .................................. 365/185 |
| 4,336,603 | 6/1982 | Kotecha et al. ............... 357/23 VT |

OTHER PUBLICATIONS

"16-K EE-PROM relies on tunneling for byte-eraseable program storage", W. S. Johnson et al., Electronics, Feb. 28, 1980, pp. 113-117.

*Primary Examiner*—Gene M. Munson
*Attorney, Agent, or Firm*—Birgit E. Morris; Donald S. Cohen; Lawrence P. Benjamin

[57] ABSTRACT

A novel, nonvolatile floating gate memory structure is described wherein the floating gate is substantially shielded from the substrate by the control gate. The control gate is provided with a pair of apertures, through which portions of the floating gate extends. One aperture serves as means for "writing" and "erasing" while the other aperture serves as means for "reading".

6 Claims, 3 Drawing Figures

ELECTRICALLY ALTERABLE, NONVOLATILE FLOATING GATE MEMORY DEVICE

BACKGROUND OF THE INVENTION

This invention relates, in general, to semiconductor memory devices and more particularly, to electrically alterable, nonvolatile floating gate memory devices.

The microprocessor based systems, as well as the relates arts, has long required electrically alterable read only memory (EAROM) elements that were nonvolatile and many such devices have, to some extent, filled this need. However, as the computer arts have become more complex in nature and have required high speeds and greater capacity there now exists the need for a high density memory device that may be easily programmed or "written" and, as the occasion arises, to reprogram ("erase" and "rewrite") the device in the field. To this end, devices are presently available to the design engineers that exhibit nonvolatile characteristics but, as will be discussed, they have inherent shortcomings that are overcome by the subject invention.

One such device resides in the family of Floating Gate Avalanche Metal Oxide Semiconductor (FAMOS) devices. The advantage of this type of device resides in the fact that it is independent of any outside current to maintain the stored information in the event power is lost or interrupted. Since these devices are independent of any outside power there is also no need to refresh the devices which feature results in a significant savings in power.

The floating gate family of devices usually has source and drain regions of a given conductivity type, formed in a substrate of the opposite conductivity type, at the surface thereof. Between the source and drain regions, and on the surface of the substrate, a gate structure is formed by first forming a thin, insulating layer of gate oxide on the substrate surface followed by the formation of a conductive layer (the floating gate). This is followed by a second insulating layer which completely surrounds the floating gate and insulates it from the remainder of the device. A second conductive layer (usually referred to as the control gate) is formed over the second insulating layer (in the region of the floating gate) to complete the gate structure. Such devices are exemplified in U.S. Pat. No. 3,500,142 issued to D. Kahng on Mar. 10, 1970. The major drawback of these devices resides in the fact that high fields are required to produce the necessary avalanche breakdown in order for charge to be placed on the floating gate. Further, to erase the charge appearing on the floating gate, the entire device must be provided with a transparent window so that the chip may be flooded with energy in the ultra violet or x-ray portion of the spectrum. Thus, it is extremely difficult to erase a single "word" without erasing all the charge on the device then requiring that the entire chip be completely reprogrammed. Further, the erasing step required an extremely long period of exposure time, of the order of about 30 to 45 minutes, with the device or chip removed from the equipment.

In recent years, the art has progressed to the point where nonvolatile floating gate read only memory devices have been produced and which are electrically alterable. One such memory cell has been described in detail in an article entitled "16-K EE-PROM Relies on Tunneling for Byte-Erasable Program Storage" by W. S. Johnson, et al., ELECTRONICS, Feb. 28, 1980, pp. 113-117. In this article the authors describe a "Floating-Gate Tunnel Oxide" structure wherein a cell, using a polycrystalline silicon (polysilicon) floating gate structure, is charged with electrons (or holes) through a thin oxide layer positioned between the polysilicon gate and the substrate using the Fowler-Nordheim tunneling mechanism. An elevation view of a typical device is described, and shown in FIG. 1 of the article, wherein the floating gate member represents the first polysilicon level. However, by using the type of structure therein described where the floating gate (the first level polysilicon since it is closest to the substrate) is covered by and insulated from a second polysilicon level, an inordinately high floating gate-to-substrate capacitance is produced. This area of floating gate is necessary in order to maintain close coupling between the first and second polysilicon levels. It has been found that some manufacturers find it necessary to etch away portions of the first polysilicon level in order to reduce the capacitance between the floating gate and the substrate without substantially reducing the capacitance between the first and second polysilicon levels.

In my recent application for Letters Patent, filed in the U.S. Patent and Trademark Office on Oct. 18, 1982, Ser. No. 437,271 entitled "AN ELECTRICALLY ALTERABLE, NONVOLATILE FLOATING GATE MEMORY DEVICE", and assigned to the same assignee as the subject application, I describe a novel configuration of floating gate memory device wherein the floating gate is a second level polysilicon rather than the traditional first level polysilicon in order that the second level polysilicon floating gate be shielded from the substrate. The first level floating gate is made to extend through the aperture so that only a relatively small area of the second level floating gate is coupled to the substrate for the write and erase functions. Such a structure reduces the otherwise high floating gate-to-substrate capacitance.

SUMMARY OF THE INVENTION

The nonvolatile memory cell of the subject invention is provided with a shielded floating gate structure using the Fowler-Nordheim tunneling mechanism to charge the floating gate. The layer shielding the floating gate from the substrate covers the entire channel region except where it provides a "read window" through which the floating gate is coupled to the channel region. The net result is improved read efficiency.

DETAILED DESCRIPTION OF THE PREFERRED EMBODIMENT

Figure 1:
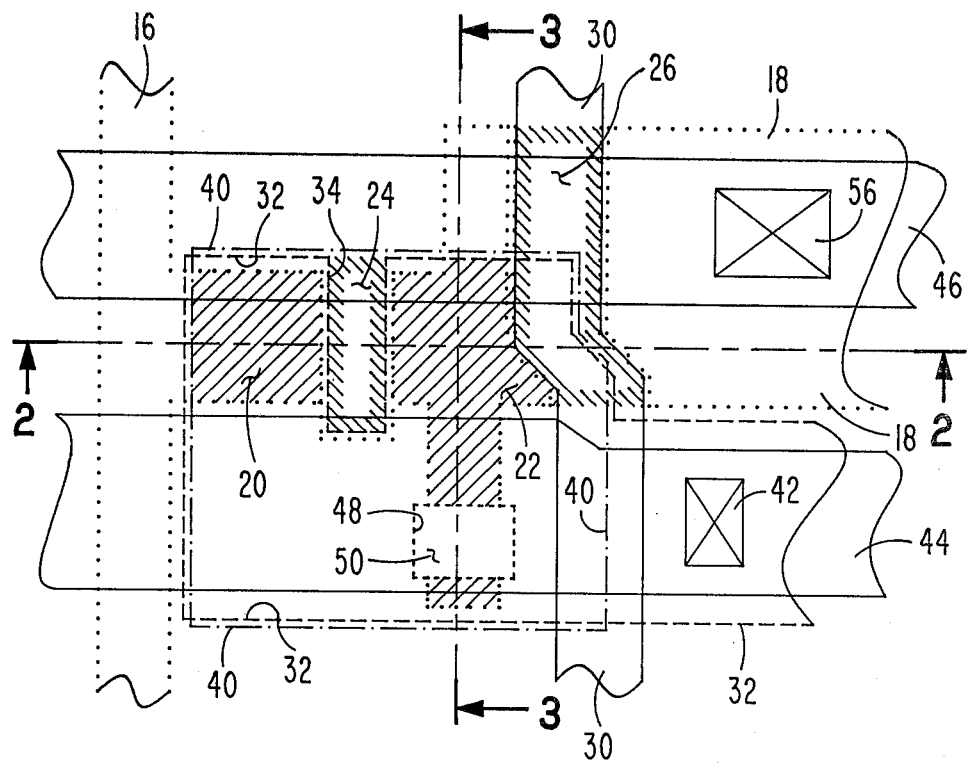
FIG. 1 is a plan view of an electrically alterable, nonvolatile floating gate memory device made in accordance with the teachings of my invention.

In the following drawings, illustration of the insulation layers existing between the floating gate and the substrate and between the floating gate and the control gate, etc., has been omitted for the sake of clarity in the drawing.

Figure 2:
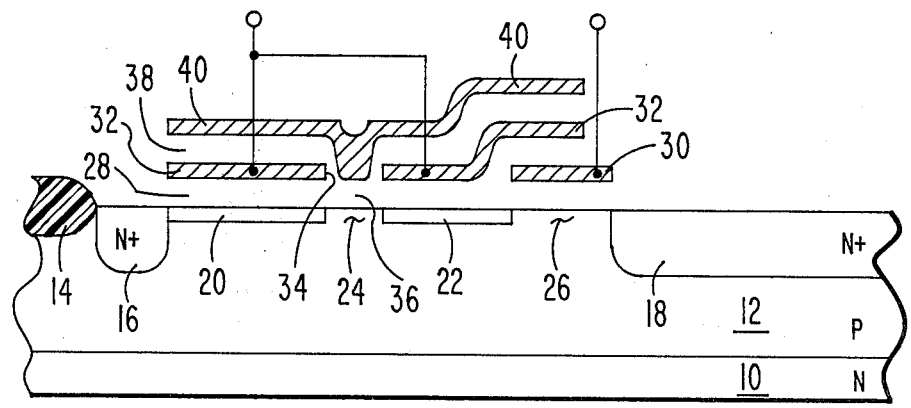
FIG. 2 is a cross-sectional view of my novel memory device taken along line 2—2 of FIG. 1.
Figure 3:
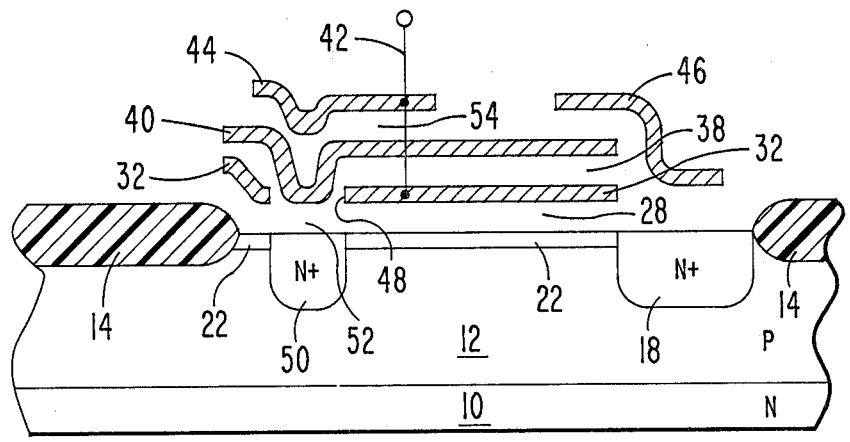
FIG. 3 is a cross-sectional, elevation view of my novel memory device taken along 3—3 of FIG. 1.

Referring now to FIGS. 1, 2 and 3 there is shown a P well 12 formed in an N type substrate 10. Source and drain regions 16 and 18 respectively are formed at the surface of P well 12 with conductivity modifying ions of a type opposite to that of P well 12. Within P well 12, and positioned between source and drain regions 16 and 18, is a channel region consisting of source extension portion 20 and floating source portion 22 each of which have conductivity modifiers therein sufficient to form N-type depletion regions. Depletion regions 20 and 22 are separated by a read channel portion 24 while depletion region 22 and drain region 18 are separated by word line channel portion 26. At the surface of P well 12 are field oxide regions 14 which define the limits of the active regions consisting of source and drain regions 16 and 18, depletion regions 20 and 22 and channel portions 24 and 26. Polycrystalline silicon (polysilicon) layer 30, the word line, is positioned above the channel region, so as to be aligned with word line channel portion 26 and is insulated therefrom by a layer of silicon oxide having a thickness of about 1000 angstroms. Positioned above the remainder of the channel region is polysilicon layer 32 which serves as a shield and control gate and has a read window aperature 34 therein aligned with the read channel portion 24. Shield or control gate member 32 is separated and insulated from the surface of P well 12 by means of insulator layer 28 having a thickness of about 1000 angstroms. Typically, this may be a layer of silicon oxide. Polysilicon layer 40, representing the floating gate is positioned above the polysilicon control gate member 32 and is shown having a portion thereof extending through read window aperture 34. Floating gate 40 is insulated from control gate 32 by, for example, a silicon oxide insulator layer 38 having a thickness of about 2500 angstroms while the extension of floating gate 40, through read window aperture 34, is insulated from the surface of the channel region by an insulating layer 36 having a thickness of about 1000 angstroms. The area of the coupling of the floating gate layer 40 to the substrate through read window aperture 34 is herein referred to as the read window.

As shown in FIG. 1 the surface of control gate 32 is shown generally to be "U" shaped, with the opening, as defined by aperture 34, representing the read window. Aperture 48, together with the N-doped region 50 (FIG. 3) represents a "write" and "erase" window the function of which is similar to the "write" and "erase" window and described in my copending application. Accordingly, application Ser. No. 437,271 is incorporated herein, in its entirety, by reference.

As shown in FIG. 1 (and symbolically in FIG. 3) contact 42 is the means for electrically connecting metal line 44 to polysilicon control gate 32 so that when the voltage shown in the accompanying table is applied to line 44, the same voltage will also be applied to control gate 32. Contact 56 is the drain contact providing an electrical, ohmic contact between metal line 46 and doped drain region 18. As shown in FIG. 3, metal line 44, as well as metal drain line 46, are separated and insulated from floating gate member 40 by means of insulating layer 54 having a thickness of about 6000 angstroms.

As shown and described in my prior application Ser. No. 437,271, the write/erase functiona are here provided by means of the aperture 48 located in the shield member 32, with aperture 48 positioned over the write/erase N doped region 50. Floating gate 40 has a portion that extends through aperture 48 in shield member 32 and is insulated from the surface of the channel region by means of insulating layer 52 which has a thickness of about 90-120 angstroms.

The following table shows the potentials which are applied to the various elements of the device herein described, in order to erase, write and read any charge on floating gate 40. In the table, the various potentials shown under the columns entitled "ERASE", "WRITE", and "READ" are applied to those elements shown under the column entitled "ELEMENT".

| ELEMENT | ERASE | WRITE | READ |
|---|---|---|---|
| Drain (18) | +20v | 0v | +5v |
| Source (16) | +20v | 0v | +0v |
| Control gate (32) | 0v | +20v | +5v |
| P-Well (12) | 0v | 0v | 0v |
| Word Line (30) | +20v | +20v | +5v |

Thus, as shown in the above table, "to erase" the device, a 20 volt signal is initially applied to drain 18, source 16 and word line 30, while control gate 32 and P well 12 are maintained at 0 volts. This erase cycle will place a positive charge on floating gate 40 which puts region 24 in a low threshold (high conduction) state. In the high conduction state, with the read channel portion 24 inverted and depletion regions 20 and 22 conductive it should now be obvious that there will be no electron flow between source 16 and drain 18 unless and until the proper read voltage is applied to word line 30 in order to invert word line channel portion 26. This provides a convenient method of checking the device to determine if it is, in fact, erased. To "write" a 20 volts signal is applied to control gate 32 and word line 30 and 0 volts is applied to drain and source regions 18, 16 and P well 12. This, in effect, places a negative charge on floating gate 40 which places read channel portion 24 in a high threshold (low conduction) state. In the low conduction state, the negative charge on floating gate 40 prevents the read channel 24 portion from being inverted and thus, no conduction can take place between depletion regions 20 and 22 or between source and drain regions 16 and 18 respectively. To "read" the device, that is, to determine whether the cell is in a high or a low threshold state, 5 volts is placed on drain 18, program line 44 and word line 30, while the source region and P well 12 is placed at 0v. The indication of conduction will signify the presence of a low threshold (high conduction) state.

While I have chosen to describe my device in terms of multiple layers of polysilicon, I do not wish to be so limited. It should now be obvious to those skilled in the art that various other conductive layers such as layers formed of refractory metals, refractory metal silicides and etc., or any combination thereof, may be used in place of polysilicon layers 30, 32 and 40.

What is claimed is:

1. In a floating gate memory device of the type including a body of semiconductor material of a first conductivity type having first and second doped regions of a second conductivity type formed in the semiconductor body at the surface thereof, the first and second doped regions spaced one from the other to define a channel region therebetween in the semiconductor body for supporting current flow between the doped regions, a first conductive layer insulated from the body of the semiconductor material, a second conductive layer positioned over both the channel region and the first conductive layer and insulated therefrom, the first conductive layer having a first aperture therein into which the second conductive layer extends, the improvement comprising:
- a first portion of the channel region, adjacent the first doped region having a pair of depletion type regions embedded in the semiconductor body at the surface thereof and spaced one from the other to define a first channel portion therebetween;
- a second aperture in the first layer of polysilicon, aligned with the first channel portion, into which a portion of the second conductive layer extends;
- a second channel portion adjacent the second doped region and occupying the remainder of the channel region; and
- a third conductive layer positioned over and insulated from the second channel portion.

2. The floating gate memory device of claim 1, wherein:
- the first and second doped regions are source and drain regions, respectively; and
- one of the pair of depletion regions is adjacent to the source region.

3. The floating gate memory device of claim 2, wherein:
- the first conductive layer is a control gate;
- the second conductive layer is a floating gate; and
- the third conductive layer is a word line.

4. The floating gate memory device of claim 3, wherein:
- the control gate and the word line are each insulated from the surface of the channel region by a layer of silicon oxide of about 1,000 angstroms; and
- the portion of the floating gate that extends into the second aperture in the control gate is insulated from the channel region by a layer of silicon oxide of about 1,000 angstroms.

5. The floating gate memory device of claim 4, wherein:
- the body of semiconductor material is a well region of the first conductivity type formed in a substrate of the second conductivity type.

6. The floating gate memory device of claim 5 wherein:
- the material of the first, second and third conductive layers are selected from the group consisting of doped polycrystalline silicon, a refractory metal and a refractory metal silicide.

* * * * *

UNITED STATES PATENT AND TRADEMARK OFFICE
CERTIFICATE OF CORRECTION

PATENT NO. : 4,417,264

DATED : November 22, 1983

INVENTOR(S) : RODNEY L. ANGLE

It is certified that error appears in the above-identified patent and that said Letters Patent is hereby corrected as shown below:

On the TITLE SHEET, add the following:

-- [30] FOREIGN APPLICATION PRIORITY DATA

09 March 1982 [GB] United Kingdom.....8206900 --.

Signed and Sealed this

Twenty-first Day of August 1984

[SEAL]

Attest:

GERALD J. MOSSINGHOFF

Attesting Officer     Commissioner of Patents and Trademarks